(12) United States Patent
Nale (10) Patent No.: US 12,190,979 B2
(45) Date of Patent: Jan. 7, 2025

(54) DYNAMIC RANDOM ACCESS MEMORY BUILT-IN SELF-TEST POWER FAIL MITIGATION

(71) Applicant: Intel Corporation, Santa Clara, CA (US)

(72) Inventor: Bill Nale, Livermore, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 18/373,658

(22) Filed: Sep. 27, 2023

(65) Prior Publication Data

US 2024/0021263 A1 Jan. 18, 2024

Related U.S. Application Data

(63) Continuation of application No. 16/781,502, filed on Feb. 4, 2020, now abandoned.

(51) Int. Cl.
*G11C 29/44* (2006.01)
*G06F 11/30* (2006.01)
(Continued)

(52) U.S. Cl.
CPC .......... *G11C 29/46* (2013.01); *G06F 11/3037* (2013.01); *G06F 11/3058* (2013.01);
(Continued)

(58) Field of Classification Search
CPC ..... G11C 29/46; G11C 29/021; G11C 29/022; G11C 29/44; G11C 29/76; G11C 29/4401;
(Continued)

(56) References Cited

U.S. PATENT DOCUMENTS 6,426,911 B1 * 7/2002 Lehmann ............... G11C 17/18
365/225.7
7,031,866 B1 * 4/2006 Behera .................. G11C 29/56
702/117
(Continued)

FOREIGN PATENT DOCUMENTS

WO 2020154647 A1 7/2020

OTHER PUBLICATIONS

Final Office Action for U.S. Appl. No. 16/781,502, Mailed Jun. 28, 2023, 9 pages.
(Continued)

*Primary Examiner* — Michael T Tran
(74) *Attorney, Agent, or Firm* — Compass IP Law PC (57) ABSTRACT

Self-test and repair of memory cells is performed in a memory integrated circuit by two separate processes initiated by a memory controller communicatively coupled to the memory integrated circuit. To ensure that the repair process is completed in the event of an unexpected power failure, a first process is initiated by the memory controller to perform a memory Built-in Self Test (mBIST) in the memory integrated circuit and a second process is initiated by the memory controller after the mBIST has completed to perform repair of faulty memory cells detected during the MBIST process. The memory controller does not initiate the repair process if a power failure has been detected. In addition, a repair time associated with the repair process is selected such that the repair time is sufficient to complete the repair process while power is stable, if a power failure occurs after the repair process has been started.

16 Claims, 4 Drawing Sheets

(51) Int. Cl.
*G06F 11/32* (2006.01)
*G11C 29/00* (2006.01)
*G11C 29/02* (2006.01)
*G11C 29/46* (2006.01)

(52) U.S. Cl.
CPC .......... *G06F 11/326* (2013.01); *G11C 29/021* (2013.01); *G11C 29/022* (2013.01); *G11C 29/44* (2013.01); *G11C 29/76* (2013.01)

(58) Field of Classification Search
CPC . G06F 11/3037; G06F 11/3058; G06F 11/326
USPC .................................................. 365/201, 222
See application file for complete search history.

(56) References Cited

U.S. PATENT DOCUMENTS

| | | |
|---|---|---|
| 9,158,619 B2 | 10/2015 | Kobla et al. |
| 2004/0136257 A1* | 7/2004 | Nelson ................. G11C 29/802 365/201 |
| 2005/0047260 A1* | 3/2005 | Yamasaki ............... G11C 29/20 365/232 |
| 2006/0048031 A1* | 3/2006 | Aadsen ............... G06F 11/1008 714/E11.034 |
| 2010/0195425 A1* | 8/2010 | Urakawa ............ G11C 29/4401 365/201 |
| 2012/0317352 A1 | 12/2012 | Kang et al. |
| 2014/0078842 A1 | 3/2014 | Oh et al. |
| 2016/0062819 A1 | 3/2016 | Oh et al. |
| 2018/0024189 A1* | 1/2018 | Douskey ................ G11C 29/44 714/733 |
| 2019/0288805 A1 | 9/2019 | Chung et al. |
| 2020/0243158 A1 | 7/2020 | Wilson |
| 2021/0191829 A1 | 6/2021 | Muthiyalu et al. |
| 2021/0311818 A1 | 10/2021 | Zimmer et al. |
| 2022/0328125 A1* | 10/2022 | Wilson ................... G11C 29/76 |

OTHER PUBLICATIONS

First Office Action for U.S. Appl. No. 16/781,502, Mailed Mar. 2, 2023, 8 pages.

PCT Patent Application No. PCT/CN2018/105882, Filed Sep. 15, 2018, 52 pgs.

Sridhar, et al., "Built-in self-repair (BISR) technique widely Used to repair embedded random access memories (RAMs)", International Journal of Computer Science Engineering (IJCSE), vol. 1 No. Sep. 1, 2012, 19 pages.

* cited by examiner

DYNAMIC RANDOM ACCESS MEMORY BUILT-IN SELF-TEST POWER FAIL MITIGATION

CLAIM OF PRIORITY

This application is a continuation of previously filed U.S. patent application Ser. No. 16/781,502, filed Feb. 4, 2020, the entire contents of which is incorporated herein by reference in its entirety.

FIELD

This disclosure relates to memory and in particular to power fail mitigation of memory during a hard post package repair of the memory.

BACKGROUND

Post Package Repair (PPR) is a repair process that is employed in repairing a single row of memory cells in a Bank Group (BG) memory region of a Double Data Rate fourth generation (DDR4) and subsequent generation Synchronous Dynamic Random Access Memory (SDRAM) device (for example, DDR4 SDRAM that complies with a standard promulgated by Joint Electronic Device Engineering Council (JEDEC)). Upon detection of a row of memory cells having one or more defective memory cells, the row address to the defective row may be remapped to a spare row, that is, a previously unused row of memory cells. Thus, read or write operations which would have been directed to the defective row are instead redirected to the spare row of memory cells which takes the place of the defective row of memory cells as a replacement row of memory cells. In this manner, the defective row of memory cells in the DRAM is "repaired."

One known Post Package Repair has two modes: soft Post Package Repair (sPPR) and hard Post Package Repair (hPPR). Soft Post Package Repair (sPPR) provides for quickly, but temporarily, repairing a row element in a Bank Group (BG). In contrast, a hard Post Package repair takes significantly longer than a soft Post Package Repair but is permanent. Hard Post Package Repair can program electrical fuses to disconnect rows and columns with faulty memory cells and replace them with redundant rows or columns.

A memory controller communicatively coupled to a SDRAM may detect a defective row of memory cells in the SDRAM and store the row address of the defective row in a register. Upon the next reboot of the system, the memory controller can send a command to the SDRAM with the row address of defective row to undertake the Post Package Repair to substitute a spare row for the defective row.

BRIEF DESCRIPTION OF THE DRAWINGS

Features of embodiments of the claimed subject matter will become apparent as the following detailed description proceeds, and upon reference to the drawings, in which like numerals depict like parts, and in which:

Although the following Detailed Description will proceed with reference being made to illustrative embodiments of the claimed subject matter, many alternatives, modifications, and variations thereof will be apparent to those skilled in the art. Accordingly, it is intended that the claimed subject matter be viewed broadly, and be defined as set forth in the accompanying claims.

DESCRIPTION OF EMBODIMENTS

A test and hard repair process can be performed in a memory integrated circuit (for example, a SDRAM). Built-in Self-Test (BIST) is the technique of including additional circuitry into an integrated circuit to allow the integrated circuit to perform a self-test to verify all or a portion of the internal functionality of the integrated circuit. The memory integrated circuit can include a memory MST (mBIST), a self-testing mechanism to test the memory using a set of algorithms to detect faults in a memory cell.

Typically, a memory BIST includes an internal clock, address and data generators and read/write controller logic to generate test patterns to test the memory in the memory integrated circuit. After the memory BIST has tested the memory and detected faulty memory cells, the test and hard repair process uses the result of the memory BIST to perform self-repair of detected faulty memory cells using redundant memory cells.

The test and hard repair process can take up to ten seconds. In a system in which a SDRAM device is powered by the power-rail (that is, battery backup power is not available), an unexpected power failure during a hard Post Package Repair of detected faulty memory cells in the SDRAM device may result in electrical fuses that are partially blown, making the SDRAM device unusable.

To ensure that the hard repair process is completed in the event of an unexpected power failure, two separate processes are initiated by a memory controller communicatively coupled to the memory integrated circuit and performed in the memory integrated circuit instead of performing a single test and repair process in the memory integrated circuit. A first process is initiated by the memory controller to perform the mBIST and a second process is initiated by the memory controller after the MBIST has completed to perform the hard repair of faulty memory cells detected during the mBIST process.

The first process to perform the mBIST in the SDRAM takes a long time (for example, about nine seconds). However, an unexpected power failure during the first process to perform the mBIST does not result in a failure of any memory cells in the SDRAM. The time period to perform the hard repair process is much shorter than the time period to perform the mBIST in the SDRAM. Thus, to ensure that the hard repair process is completed while power is stable, after the mBIST has been completed, the memory controller does not initiate the hard repair process if a power failure has been detected. In addition, a hard repair time associated with the hard repair process is selected such that the hard repair time is sufficient to complete the hard repair process while power is stable, if a power failure occurs after the hard repair process has been started.

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

Figure 1:
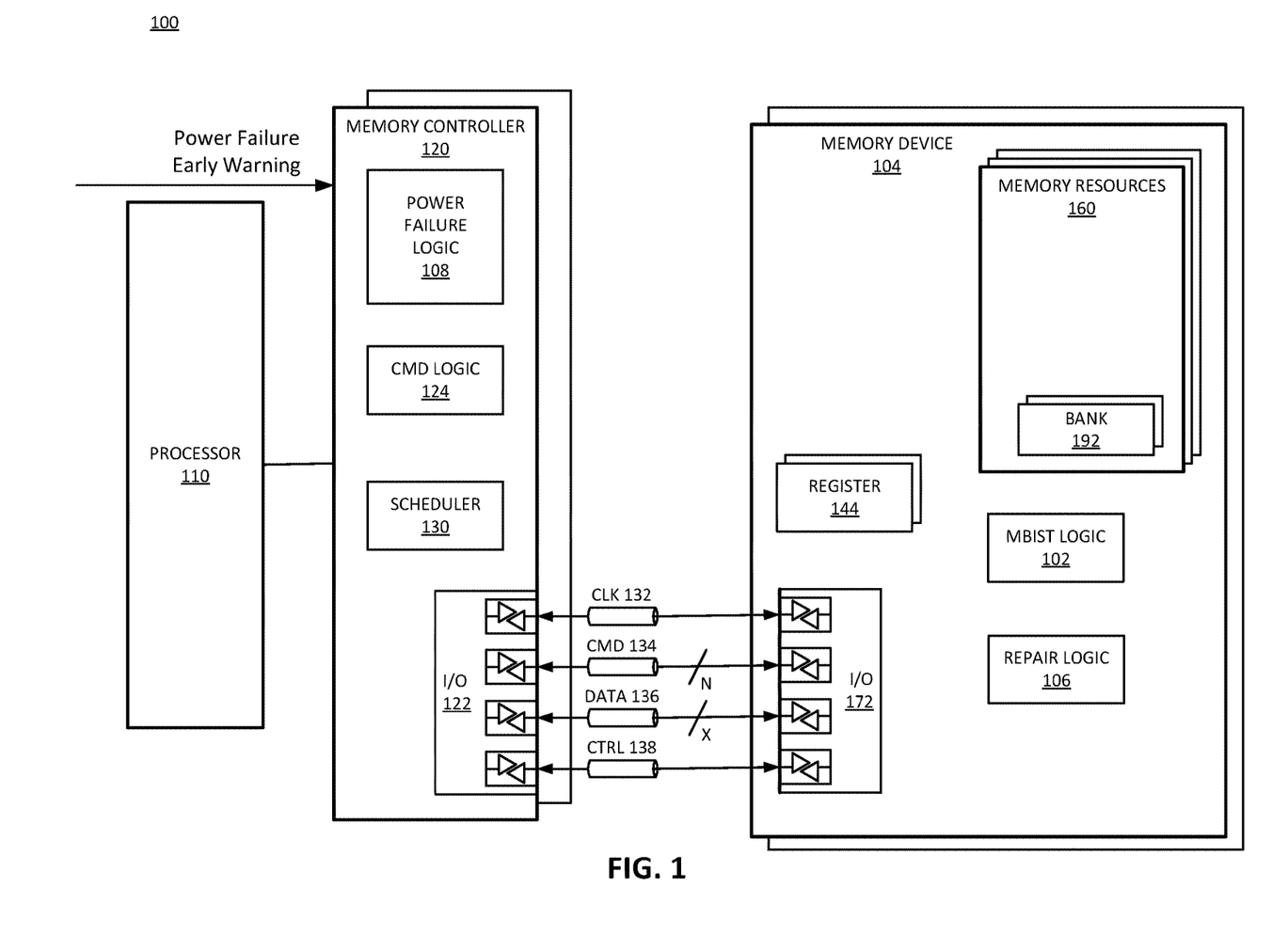
FIG. 1 is a block diagram of an embodiment of a system with a memory subsystem including at least one memory device coupled to a memory controller.

FIG. 1 is a block diagram of an embodiment of a system 100 with a memory subsystem including at least one memory device 104 coupled to a memory controller 120. System 100 includes a processor 110 and elements of a memory subsystem in a computing device. Processor 110 represents a processing unit of a computing platform that can execute an operating system (OS) and applications, which can collectively be referred to as the host or user of the memory. The OS and applications execute operations that result in memory accesses. Processor 110 can include one or more separate processors. Each separate processor can include a single processing unit, a multicore processing unit, or a combination. The processing unit can be a primary processor such as a CPU (central processing unit), a peripheral processor such as a GPU (graphics processing unit), or a combination. Memory accesses may also be initiated by devices such as a network controller or storage controller. Such devices can be integrated with the processor in some systems (for example, in a System-on-Chip (SoC)) or attached to the processer via a bus (e.g., PCI express), or a combination.

Reference to memory devices can apply to different memory types. Memory devices often refers to volatile memory technologies. Volatile memory is memory whose state (and therefore the data stored on it) is indeterminate if power is interrupted to the device. Nonvolatile memory refers to memory whose state is determinate even if power is interrupted to the device. One example of dynamic volatile memory includes DRAM (dynamic random access memory), or some variant such as synchronous DRAM (SDRAM). A memory subsystem as described herein may be compatible with a number of memory technologies, such as DDR3 (double data rate version 3, original release by JEDEC (Joint Electronic Device Engineering Council) on Jun. 27, 2007, currently on release 21), DDR4 (DDR version 4, JESD79-4 initial specification published in September 2012 by JEDEC), DDR4E (DDR version 4, extended, currently in discussion by JEDEC), LPDDR3 (low power DDR version 3, JESD209-3B, August 2013 by JEDEC), LPDDR4 (LOW POWER DOUBLE DATA RATE (LPDDR) version 4, JESD209-4, originally published by JEDEC in August 2014), WIO2 (Wide I/O 2 (WideIO2), JESD229-2, originally published by JEDEC in August 2014), HBM (HIGH BANDWIDTH MEMORY DRAM, JESD235, originally published by JEDEC in October 2013), DDR5 (DDR version 5, currently in discussion by JEDEC), LPDDR5, HBM2 (HBM version 2)), or others or combinations of memory technologies, and technologies based on derivatives or extensions of such specifications.

Descriptions herein referring to a "RAM" or "RAM device" can apply to any memory device that allows random access, whether volatile or nonvolatile. Descriptions referring to a "DRAM" or a "DRAM device" can refer to a volatile random access memory device. The memory device or DRAM can refer to the die itself, to a packaged memory product that includes one or more dies, or both.

Memory controller 120 represents one or more memory controller circuits or devices for system 100. Memory controller 120 represents control logic that generates memory access commands in response to the execution of operations by processor 110. Memory controller 120 accesses one or more memory devices 104. Memory devices 104 can be DRAM devices in accordance with any referred to above. Memory controller 120 includes I/O interface logic 122 to couple to a memory bus. I/O interface logic 122 (as well as I/O interface logic 172 of memory device 104) can include pins, pads, connectors, signal lines, traces, or wires, or other hardware to connect the devices, or a combination of these. I/O interface logic 122 can include a hardware interface. As illustrated, I/O interface logic 122 includes at least drivers/transceivers for signal lines. Commonly, wires within an integrated circuit interface couple with a pad, pin, or connector to interface signal lines or traces or other wires between devices. I/O interface logic 122 can include drivers, receivers, transceivers, or termination, or other circuitry or combinations of circuitry to exchange signals on the signal lines between the devices.

The exchange of signals includes at least one of transmit or receive. While shown as coupling I/O interface logic 122 from memory controller 120 to I/O interface logic 172 of memory device 104, it will be understood that in an implementation of system 100 where groups of memory devices 104 are accessed in parallel, multiple memory devices can include I/O interfaces to the same interface of memory controller 120. Other memory controllers 120 can include separate interfaces to other memory devices 104.

The bus between memory controller 120 and memory devices 104 can be a double data rate (DDR) high-speed DRAM interface to transfer data that is, implemented as multiple signal lines coupling memory controller 120 to memory devices 104. The bus may typically include at least clock (CLK) 132, command/address (CMD) 134, and data (write data (DQ) and read data (DQO) 136, and zero or more control signal lines 138. In one embodiment, a bus or connection between memory controller 120 and memory device 104 can be referred to as a memory bus. The signal lines for CMD can be referred to as a "C/A bus" (or ADD/CMD bus, or some other designation indicating the transfer of commands (C or CMD) and address (A or ADD) information) and the signal lines for data (write DQ and read DQ) can be referred to as a "data bus." It will be understood that in addition to the lines explicitly shown, a bus can include at least one of strobe signaling lines, alert lines, auxiliary lines, or other signal lines, or a combination. It will also be understood that serial bus technologies can be used for the connection between memory controller 120 and memory devices 140. An example of a serial bus technology is 8B10B encoding and transmission of high-speed data with embedded clock over a single differential pair of signals in each direction.

In one embodiment, memory devices 104 can be organized into memory modules. In one embodiment, memory modules represent dual inline memory modules (DIMMs). Memory modules can include multiple memory devices 104, and the memory modules can include support for multiple separate channels to the included memory devices 104 disposed on them.

Memory devices 104 each include memory resources 160. Memory resources 160 represent individual arrays of memory locations or storage locations for data. Typically, memory resources 160 are managed as rows of data, accessed via word line (rows) and bit line (individual bits within a row) control. Memory resources 160 can be organized as separate banks of memory. Banks 192 may refer to arrays of memory locations within a memory device 104. In one embodiment, banks of memory are divided into sub-banks with at least a portion of shared circuitry (e.g., drivers, signal lines, control logic) for the sub-banks.

In one embodiment, memory devices 104 include one or more registers 144. Register 144 represents one or more storage devices or storage locations that provide configuration or settings for the operation of the memory device. In one embodiment, register 144 can provide a storage location for memory device 104 to store data for access by memory controller 120 as part of a control or management operation. In one embodiment, register 144 includes one or more Mode Registers. In one embodiment, register 144 includes one or more multipurpose registers. The configuration of locations within register 144 can configure memory device 104 to operate in different "mode," where command information can trigger different operations within memory device 104 based on the mode. Additionally, or in the alternative, different modes can also trigger different operation from address information or other signal lines depending on the mode. Settings of register 144 can indicate configuration for I/O settings (e.g., timing, termination, driver configuration, or other I/O settings).

Memory controller 120 includes scheduler 130, which represents logic or circuitry to generate and order transactions to send to memory device 104. From one perspective, the primary function of memory controller 120 is to schedule memory access and other transactions to memory device 104. Such scheduling can include generating the transactions themselves to implement the requests for data by processor 110 and to maintain integrity of the data (e.g., such as with commands related to memory test and hard repair).

Transactions can include one or more commands, and result in the transfer of commands or data or both over one or multiple timing cycles such as clock cycles or unit intervals. Transactions can be for access such as read or write or related commands or a combination, and other transactions can include memory management commands for configuration, settings, data integrity, or other commands or a combination.

Referring again to memory controller 120, memory controller 120 includes command (CMD) logic 124, which represents logic or circuitry to generate commands to send to memory devices 104. The generation of the commands can refer to the command prior to scheduling, or the preparation of queued commands ready to be sent. Generally, the signaling in memory subsystems includes address information within or accompanying the command to indicate or select one or more memory locations where the memory devices should execute the command. In response to scheduling of transactions for memory device 104, memory controller 120 can issue commands via I/O interface logic 122 to cause memory device 104 to execute the commands. Memory controller 120 can implement compliance with standards or specifications by access scheduling and control.

Memory controller 120 also includes power failure logic 108, which represents logic or circuitry to monitor a state of a power failure early warning signal. The state of the power failure early warning signal can be used to determine whether to send a hard repair command to the memory device 104.

The memory device 104 includes memory Built-in-Self-Test (mBIST) logic 102. The mBIST logic 102 includes an internal clock, address and data generators and read/write controller logic to generate test patterns to test the memory resources 160 in the memory device 104. The mBIST logic 102 uses a pattern to test memory cells in the memory resources 160 in response to a sequence of writes to mode registers received from the memory controller 120. The sequence of writes to mode registers in the memory device 104 includes a write to set a bit in a first mode register in register 144 in the memory device 104 to start the mBIST operation, followed by writing a guard key multiple times to a second mode register in register 144 in the memory device 104. The guard key is written multiple times to the second mode register to ensure that the mBIST operation is not initiated by accidentally setting the bit to start the mBIST operation in the first mode register.

After the mBIST logic 102 has completed the test of the memory resources 160 (that is, the completion of the in-memory test), the mBIST logic 102 reports status of the test of the memory cells in the memory resources 160 via a mode register in register 144 that is read by the memory controller 120. The status of the test of the memory cells can be represented by the state of one or more bits in the mode register in register 144 that can indicate no errors found, errors found that require repair operation(s) or too many errors to repair.

The memory device 104 also includes hard repair logic 106. The hard repair logic 106 performs hard repair of faulty memory cells that are detected by the mBIST logic 102. After the mBIST logic 102 has completed the test, if the mBIST logic 102 detects failed memory cells in memory resources 160 and a power failure has not been detected by the power failure logic 108, the memory controller 120 sends a hard repair command to the memory device 104 to perform the hard repair of the failed memory cells (that is, a failed portion of the memory device 104) via a mode register. In an embodiment, the hard repair command is sent to the memory device by setting a bit ("perform repair") in a mode register in the memory device 104. The repair logic 106 in the memory device 104 determines the memory cells in memory resources 160 to be repaired based on the result of the test performed by the mBIST logic 102 that are stored in the memory device 104.

One hard repair command to perform the hard repair of the failed memory cells if the failed memory cells can be repaired within a time period (for example, 10 milliseconds (ms) to 100 ms) that a power supply will remain within a percentage of a power rail (for example, about 3%) if a power failure occurs after the command has been sent to the memory device. If the number of failed memory cells cannot be repaired within the time period, two or more hard repair commands are sent by the memory controller to perform the hard repair, each command is for a portion of the memory cells to be repaired that can be completed within the time period.

Figure 2:
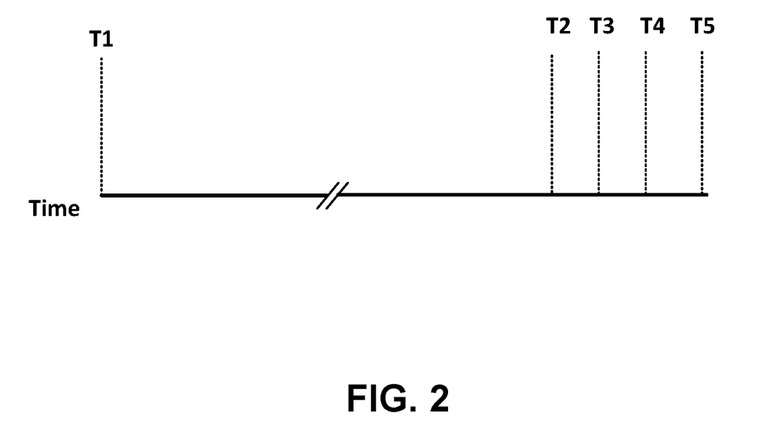
FIG. 2 is a timeline illustrating the combined test and hard repair time period in the memory device shown in FIG. 1 using separate commands for test and hard repair.

FIG. 2 is a timeline illustrating the combined test and hard repair time in the memory device 104 shown in FIG. 1 using separate commands for test and hard repair.

At time T1, the mBIST process is initiated in the memory device 104 by the memory controller via a test command sent by the memory controller to the memory device 104. The mBIST process performs a test of memory cells in memory resources 160 in the memory device 104. The mBIST process can take about nine seconds to complete.

At time T2, the hard repair process is initiated in the memory device 104 by the memory controller via a hard repair command sent by the memory controller to the memory device 104. The hard repair command is sent if faulty memory cells are detected by the mBIST process and a power failure has not been detected.

At time T3, a power failure occurs after the hard repair process has started.

At time T4, the hard repair process completes.

At time T5, the power supply is out of spec after the hard repair process has completed.

Figure 3:
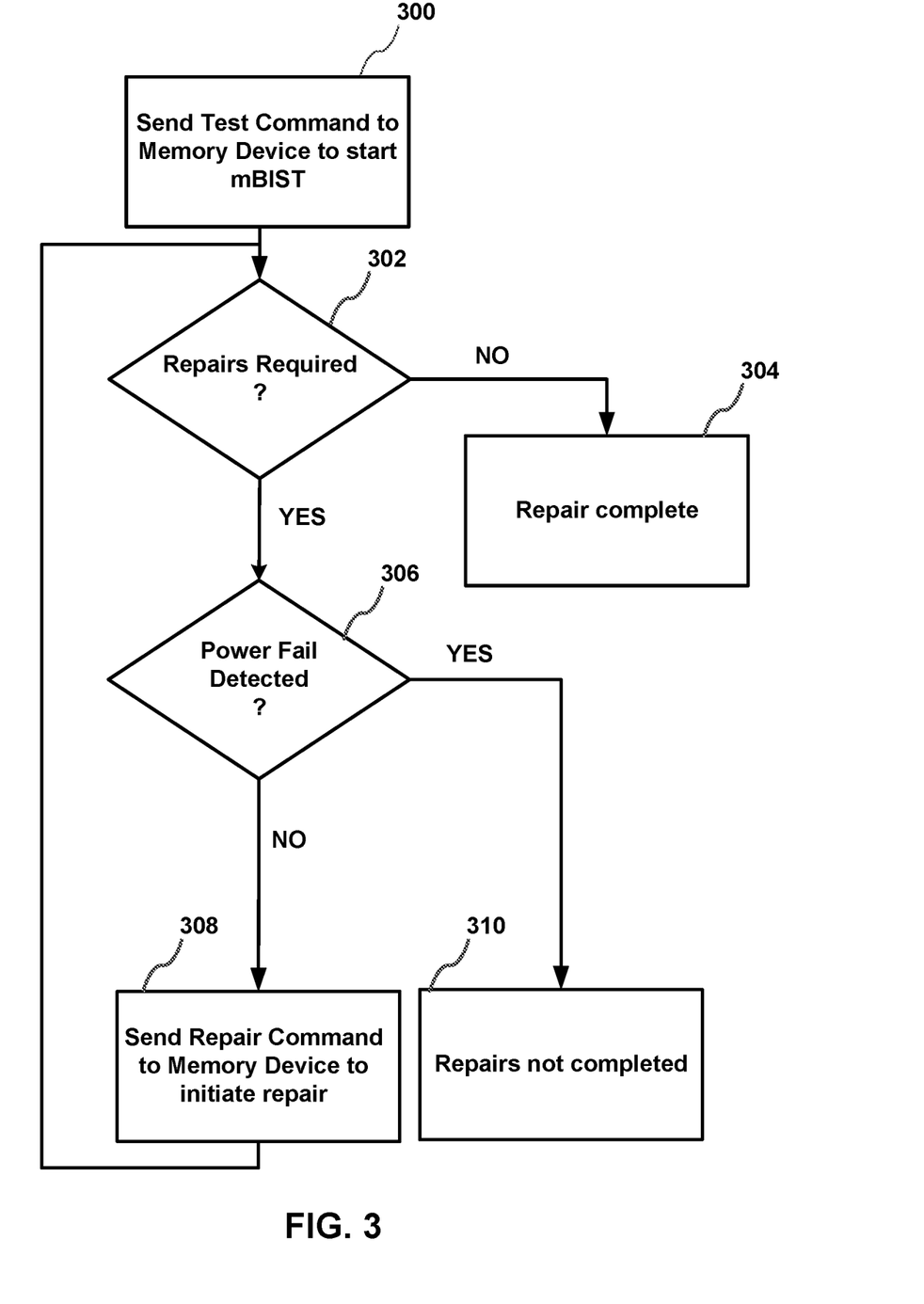
FIG. 3 is a flowgraph illustrating the use of the separate commands for test and hard repair in the system shown in FIG. 1.

FIG. 3 is a flowgraph illustrating the use of the separate commands for test and hard repair in the system shown in FIG. 1.

At block 300, the command logic 124 in the memory controller 120 sends a test command (an in-memory test command) to the memory device to start the mBIST process. After the mBIST process has completed, the memory controller 120 obtains the status of the mBIST that is stored in a mode register in the memory device 104.

At block 302, if there are faulty memory cells to be repaired, processing continues with block 306. If not processing continues with block 304.

At block 304, the hard repair process is complete.

At block 306, if a power fail has been detected, processing continues with block 310. If a power fail has not been detected, processing continues with block 308.

At block 308, a hard repair command is sent by the memory controller 120 to the memory device 104 to repair a portion or all of the faulty memory cells discovered during the mBIST. The number of faulty memory cells selected to be repaired by the hard repair command is dependent on the number of faulty memory cells that can be repaired within a time period that a power supply will remain in spec if a power failure occurs after the hard repair command has been sent to the memory device.

At block 310, a power fail has been detected prior to sending the hard repair command to the memory device 104. All or a portion of the faulty memory cells detected by the mBIST process have not been repaired.

Figure 4:
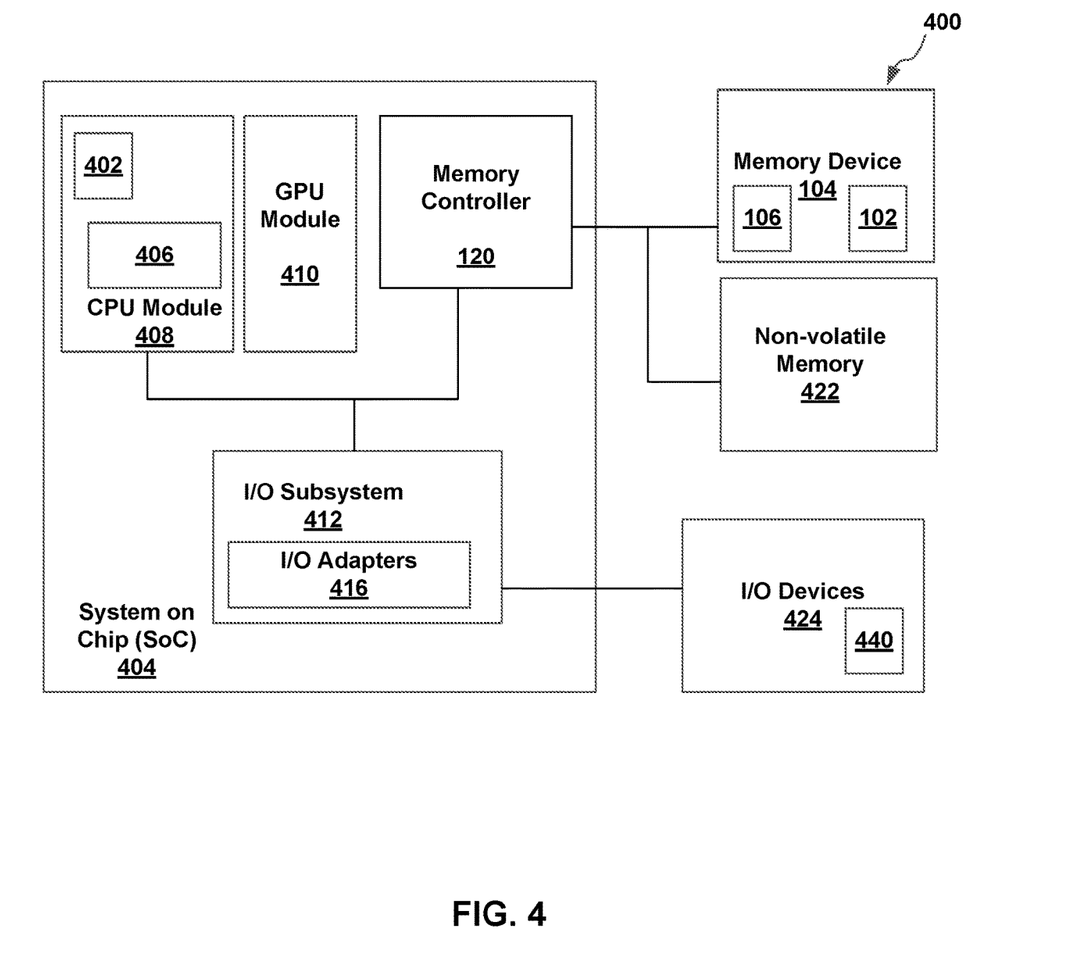
FIG. 4 is a block diagram of a system that includes the memory subsystem shown in FIG. 1.

FIG. 4 is a block diagram of an embodiment of a computer system 400 that includes the memory subsystem that includes the memory controller 120 and memory device 104 shown in FIG. 1. Computer system 400 can correspond to a computing device including, but not limited to, a server, a workstation computer, a desktop computer, a laptop computer, and/or a tablet computer.

The computer system 400 includes a system on chip (SOC or SoC) 404 which combines processor, graphics, memory, and Input/Output (I/O) control logic into one SoC package. The SoC 404 includes at least one Central Processing Unit (CPU) module 408, a memory controller 414, and a Graphics Processor Unit (GPU) 410. In other embodiments, the memory controller 414 can be external to the SoC 404. The CPU module 408 includes at least one processor core 402, and a level 2 (L2) cache 406.

Although not shown, each of the processor core(s) 402 can internally include one or more instruction/data caches, execution units, prefetch buffers, instruction queues, branch address calculation units, instruction decoders, floating point units, retirement units, etc. The CPU module 408 can correspond to a single core or a multi-core general purpose processor, such as those provided by Intel® Corporation, according to one embodiment.

The Graphics Processor Unit (GPU) 410 can include one or more GPU cores and a GPU cache which can store graphics related data for the GPU core. The GPU core can internally include one or more execution units and one or more instruction and data caches. Additionally, the Graphics Processor Unit (GPU) 410 can contain other graphics logic units that are not shown in FIG. 4, such as one or more vertex processing units, rasterization units, media processing units, and codecs.

Within the I/O subsystem 412, one or more I/O adapter(s) 416 are present to translate a host communication protocol utilized within the processor core(s) 402 to a protocol compatible with particular I/O devices. Some of the protocols that adapters can be utilized for translation include Peripheral Component Interconnect (PCI)-Express (PCIe); Universal Serial Bus (USB); Serial Advanced Technology Attachment (SATA) and Institute of Electrical and Electronics Engineers (IEEE) 1594 "Firewire".

The I/O adapter(s) 416 can communicate with external I/O devices 424 which can include, for example, user interface device(s) including a display and/or a touch-screen display 440, printer, keypad, keyboard, communication logic, wired and/or wireless, storage device(s) including hard disk drives ("HDD"), solid-state drives ("SSD"), removable storage media, Digital Video Disk (DVD) drive, Compact Disk (CD) drive, Redundant Array of Independent Disks (RAID), tape drive or other storage device. The storage devices can be communicatively and/or physically coupled together through one or more buses using one or more of a variety of protocols including, but not limited to, SAS (Serial Attached SCSI (Small Computer System Interface)), PCIe (Peripheral Component Interconnect Express), NVMe (NVM Express) over PCIe (Peripheral Component Interconnect Express), and SATA (Serial ATA (Advanced Technology Attachment)). The display and/or a touch-screen display 440 can be communicatively coupled to the processor in the SoC 404 to display data stored in the memory device 104.

Additionally, there can be one or more wireless protocol I/O adapters. Examples of wireless protocols, among others, are used in personal area networks, such as IEEE 802.15 and Bluetooth, 4.0; wireless local area networks, such as IEEE 802.11-based wireless protocols; and cellular protocols.

The memory controller 104 can also be coupled to non-volatile memory. A non-volatile memory device is a memory whose state is determinate even if power is interrupted to the device. In one embodiment, the NVM device can comprise a block addressable memory device, such as NAND technologies, or more specifically, multi-threshold level NAND flash memory (for example, Single-Level Cell ("SLC"), Multi-Level Cell ("MLC"), Quad-Level Cell ("QLC"), Tri-Level Cell ("TLC"), or some other NAND). A NVM device can also include a byte-addressable write-in-place three dimensional crosspoint memory device, or other byte addressable write-in-place NVM devices (also referred to as persistent memory), such as single or multi-level Phase Change Memory (PCM) or phase change memory with a switch (PCMS), NVM devices that use chalcogenide phase change material (for example, chalcogenide glass), resistive memory including metal oxide base, oxygen vacancy base and Conductive Bridge Random Access Memory (CB-RAM), nanowire memory, ferroelectric random access memory (FeRAM, FRAM), magneto resistive random access memory (MRAM) that incorporates memristor technology, spin transfer torque (STT)-MRAM, a spintronic magnetic junction memory based device, a magnetic tunneling junction (MTJ) based device, a DW (Domain Wall)

and SOT (Spin Orbit Transfer) based device, a thyristor based memory device, or a combination of any of the above, or other memory.

An operating system 442 is software that manages computer hardware and software including memory allocation and access to I/O devices. Examples of operating systems include Microsoft® Windows®, Linux®, iOS® and Android®.

Flow diagrams as illustrated herein provide examples of sequences of various process actions. The flow diagrams can indicate operations to be executed by a software or firmware routine, as well as physical operations. In one embodiment, a flow diagram can illustrate the state of a finite state machine (FSM), which can be implemented in hardware and/or software. Although shown in a particular sequence or order, unless otherwise specified, the order of the actions can be modified. Thus, the illustrated embodiments should be understood as an example, and the process can be performed in a different order, and some actions can be performed in parallel. Additionally, one or more actions can be omitted in various embodiments; thus, not all actions are required in every embodiment. Other process flows are possible.

To the extent various operations or functions are described herein, they can be described or defined as software code, instructions, configuration, and/or data. The content can be directly executable ("object" or "executable" form), source code, or difference code ("delta" or "patch" code). The software content of the embodiments described herein can be provided via an article of manufacture with the content stored thereon, or via a method of operating a communication interface to send data via the communication interface. A machine readable storage medium can cause a machine to perform the functions or operations described, and includes any mechanism that stores information in a form accessible by a machine (e.g., computing device, electronic system, etc.), such as recordable/non-recordable media (e.g., read only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters and/or sending signals to prepare the communication interface to provide a data signal describing the software content. The communication interface can be accessed via one or more commands or signals sent to the communication interface.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Besides what is described herein, various modifications can be made to the disclosed embodiments and implementations of the invention without departing from their scope. Therefore, the illustrations and examples herein should be construed in an illustrative, and not a restrictive sense. The scope of the invention should be measured solely by reference to the claims that follow.

Flow diagrams as illustrated herein provide examples of sequences of various process actions. The flow diagrams can indicate operations to be executed by a software or firmware routine, as well as physical operations. In one embodiment, a flow diagram can illustrate the state of a finite state machine (FSM), which can be implemented in hardware and/or software. Although shown in a particular sequence or order, unless otherwise specified, the order of the actions can be modified. Thus, the illustrated embodiments should be understood as an example, and the process can be performed in a different order, and some actions can be performed in parallel. Additionally, one or more actions can be omitted in various embodiments; thus, not all actions are required in every embodiment. Other process flows are possible.

To the extent various operations or functions are described herein, they can be described or defined as software code, instructions, configuration, and/or data. The content can be directly executable ("object" or "executable" form), source code, or difference code ("delta" or "patch" code). The software content of the embodiments described herein can be provided via an article of manufacture with the content stored thereon, or via a method of operating a communication interface to send data via the communication interface. A machine readable storage medium can cause a machine to perform the functions or operations described, and includes any mechanism that stores information in a form accessible by a machine (e.g., computing device, electronic system, etc.), such as recordable/non-recordable media (e.g., read only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters and/or sending signals to prepare the communication interface to provide a data signal describing the software content. The communication interface can be accessed via one or more commands or signals sent to the communication interface.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Besides what is described herein, various modifications can be made to the disclosed embodiments and implementations of the invention without departing from their scope.

Therefore, the illustrations and examples herein should be construed in an illustrative, and not a restrictive sense. The scope of the invention should be measured solely by reference to the claims that follow.

What is claimed is:

1. A synchronous dynamic random access memory (SDRAM) device, comprising:
    one or more mode registers, each mode register having a plurality of bits;
    a memory array;
    Memory Built-in Self Test circuitry to use patterns to test the memory array, the Memory Built-in Self Test circuitry to store a status of the test of the memory array in a first mode register; and
    repair circuitry to perform a hard repair of a first portion of faulty memory cells in the memory array detected by the Memory Built-in Self Test circuitry, the first portion of faulty memory cells capable of repair during a repair time.

2. The SDRAM device of claim 1, wherein a repair command is received via a second mode register.

3. The SDRAM device of claim 1, wherein the hard repair capable of completion during the repair time while power is stable.

4. The SDRAM device of claim 1, wherein the status of the test is no errors.

5. The SDRAM device of claim 1, wherein the repair circuitry to perform the hard repair of a second portion of faulty memory cells in the memory array detected by the Memory Built-in Self Test circuitry, the second portion of faulty memory cells capable of repair during the repair time after completion of the hard repair of the first portion of faulty memory cells.

6. A system comprising:
a dynamic random access memory (DRAM) device, comprising:
one or more mode registers, each mode register having a plurality of bits;
a memory array;
Memory Built-in Self Test circuitry to use patterns to test the memory array, the Memory Built-in Self Test circuitry to store a status of the test of the memory array in a first mode register; and
repair circuitry to perform a hard repair of a first portion of faulty memory cells in the memory array detected by the Memory Built-in Self Test circuitry, the first portion of faulty memory cells capable of repair during a repair time,
a display communicatively coupled to a processor to display data stored in the DRAM device.

7. The system of claim 6, wherein the DRAM is a Synchronous Dynamic Random Access Memory (SDRAM).

8. The system of claim 6, wherein a repair command is received via a second mode register.

9. The system of claim 6, wherein the hard repair capable of completion during the repair time while power is stable.

10. The system of claim 6, wherein the status of the test is no errors.

11. The system of claim 6, wherein the repair circuitry to perform the hard repair of a second portion of faulty memory cells in the memory array detected by the Memory Built-in Self Test circuitry, the second portion of faulty memory cells capable of repair during the repair time after completion of the hard repair of the first portion of faulty memory cells.

12. A method comprising:
testing, by Memory Built-in Self Test circuitry in a synchronous dynamic random access memory (SDRAM) device, a memory array in the DRAM using test patterns;
storing status of the testing of the memory array in a first mode register of a plurality of mode registers in the SDRAM device, each mode register having a plurality of bits; and
performing, by repair circuitry in the SDRAM device, a hard repair of a first portion of faulty memory cells in the memory array detected by the Memory Built-in Self Test circuitry, the first portion of faulty memory cells capable of repair during a repair time.

13. The method of claim 12, wherein a repair command is received via a second mode register.

14. The method of claim 12, wherein the hard repair capable of completion during the repair time while power is stable.

15. The method of claim 12, wherein the status of the testing is no errors.

16. The method of claim 12, wherein the repair circuitry to perform the hard repair of a second portion of faulty memory cells in the memory array detected by the Memory Built-in Self Test circuitry, the second portion of faulty memory cells capable of repair during the repair time after completion of the hard repair of the first portion of faulty memory cells.

* * * * *